United States Patent
Zhang et al.

(10) Patent No.: US 10,692,432 B2
(45) Date of Patent: Jun. 23, 2020

(54) PIXEL DRIVING CIRCUIT AND DRIVING METHOD THEREOF, AND LAYOUT STRUCTURE OF TRANSISTOR

(71) Applicant: KUNSHAN GO-VISIONOX OPTO-ELECTRONICS CO., LTD., Kunshan, Jiangsu Province (CN)

(72) Inventors: Lu Zhang, Kunshan (CN); Guozhe Wen, Kunshan (CN); Zhenzhen Han, Kunshan (CN); Xiujian Zhu, Kunshan (CN)

(73) Assignee: KUNSHAN GO-VISIONOX OPTO-ELECTRONICS CO., LTD., Kunshan, Jiangsu Province (CN)

( * ) Notice: Subject to any disclaimer, the term of this patent is extended or adjusted under 35 U.S.C. 154(b) by 33 days.

(21) Appl. No.: 16/324,549

(22) PCT Filed: Feb. 14, 2018

(86) PCT No.: PCT/CN2018/076788
§ 371 (c)(1),
(2) Date: Feb. 8, 2019

(87) PCT Pub. No.: WO2018/153336
PCT Pub. Date: Aug. 30, 2018

(65) Prior Publication Data
US 2019/0189055 A1    Jun. 20, 2019

(30) Foreign Application Priority Data

Feb. 22, 2017 (CN) .......................... 2017 1 0095713
Feb. 23, 2017 (CN) .......................... 2017 1 0098993

(51) Int. Cl.
*G09G 3/3233* (2016.01)
*H01L 27/12* (2006.01)
(Continued)

(52) U.S. Cl.
CPC ......... *G09G 3/3233* (2013.01); *G09G 3/3225* (2013.01); *G09G 3/3266* (2013.01);
(Continued)

(58) Field of Classification Search
CPC .................................................. G09G 3/3233
See application file for complete search history.

(56) References Cited

U.S. PATENT DOCUMENTS 7,880,236 B2    2/2011   Kerber et al.
10,607,540 B2 *  3/2020   Xi ........................ G09G 3/3233
(Continued)

FOREIGN PATENT DOCUMENTS

CN         1448902 A     10/2003
CN       101887684 A     11/2010
(Continued)

*Primary Examiner* — Sepehr Azari
(74) *Attorney, Agent, or Firm* — Chang-Ju Chiang

(57) ABSTRACT

The present disclosure provides a pixel driving circuit, a driving method thereof, and a layout structure of a transistor. The pixel driving circuit includes a storage capacitor, a first to a seventh switching transistor, a first driving transistor, a second driving transistor, and an organic light emitting diode. The layout structure includes a circuit node and an active layer connected to the circuit node; the active layer includes: a first active layer, a second active layer, and a third active layer; a first source, a drain and a second source connected to the first, the second and the third active layer, respectively; a first gate, a second gate, and a third gate corresponding to the first, the second, and the third active layer respectively; and a gate pattern composed of the first gate, the second gate, and the third gate being located above the circuit node and the active layer.

8 Claims, 9 Drawing Sheets

(51) Int. Cl.
  *G09G 3/3225* (2016.01)
  *G09G 3/3291* (2016.01)
  *G09G 3/3266* (2016.01)
  *H01L 27/32* (2006.01)

(52) U.S. Cl.
  CPC ........... *G09G 3/3291* (2013.01); *H01L 27/12* (2013.01); *H01L 27/1222* (2013.01); *H01L 27/32* (2013.01); *G09G 2300/043* (2013.01); *G09G 2300/0426* (2013.01); *G09G 2300/0819* (2013.01); *H01L 27/3262* (2013.01); *H01L 27/3276* (2013.01)

(56) References Cited

U.S. PATENT DOCUMENTS

| | | | |
|---|---|---|---|
| 2004/0080474 | A1 | 4/2004 | Kimura |
| 2013/0100173 | A1* | 4/2013 | Chaji .................... G09G 5/10 345/690 |
| 2014/0354518 | A1 | 12/2014 | Park et al. |
| 2015/0221251 | A1* | 8/2015 | Wang .................. G09G 3/3208 345/690 |
| 2016/0148575 | A1 | 5/2016 | Lai |
| 2016/0372050 | A1 | 12/2016 | Kwon et al. |
| 2017/0018229 | A1* | 1/2017 | Zhang .................. G09G 3/3233 |
| 2017/0033171 | A1* | 2/2017 | Kim .................... H01L 27/3272 |

FOREIGN PATENT DOCUMENTS

| | | |
|---|---|---|
| CN | 201893343 U | 7/2011 |
| CN | 103915510 A | 7/2014 |
| CN | 104142594 A | 11/2014 |
| CN | 104409050 A | 3/2015 |
| CN | 104485067 A | 4/2015 |
| CN | 103137067 B | 8/2015 |
| CN | 105470311 A | 4/2016 |
| CN | 105590955 A | 5/2016 |
| CN | 105702210 A | 6/2016 |
| CN | 105742240 A | 7/2016 |
| CN | 106097964 A | 11/2016 |
| CN | 108335672 A | 7/2018 |
| EP | 2402932 A1 | 1/2012 |
| TW | 201543431 A | 11/2015 |
| TW | 201610964 A | 3/2016 |
| TW | 201618069 A | 5/2016 |
| TW | 201638921 A | 11/2016 |
| TW | 201705472 A | 2/2017 |
| TW | I569248 B | 2/2017 |

* cited by examiner

PIXEL DRIVING CIRCUIT AND DRIVING METHOD THEREOF, AND LAYOUT STRUCTURE OF TRANSISTOR

CROSS REFERENCE TO RELATED APPLICATIONS

This application is a 35 U.S.C. § 371 National Phase conversion of International (PCT) Patent Application No. PCT/CN2018/076788, filed on Feb. 14, 2018, which claims the priority of Chinese Patent Application No. 201710095713.4, filed on Feb. 22, 2017, and Chinese Patent Application No. 201710098993.4, filed on Feb. 23, 2017. The contents of the above-identified applications are incorporated herein by reference. The PCT International Patent Application was filed and published in Chinese.

TECHNICAL FIELD

The present disclosure relates to display technologies, and in particular, relates to a pixel driving circuit, a driving method thereof, and a layout structure of a transistor.

BACKGROUND

Active matrix organic light emitting diode (AMOLED) display is one of the hotspots in display research field. Compared with liquid crystal displays, organic light emitting diodes (OLED) have the advantages of low energy consumption, low production cost, self-illumination, wide viewing angle, fast response and etc.

In AMOLED display products, the brightness of a pixel is determined by the amount of current flowing through the organic light emitting diode, and the amount of the current is controlled by a driving thin film transistor in the pixel driving circuit. In the case the displays have the same brightness, as pixels per inch (PPI) of the display increases, the current required by each pixel becomes smaller and smaller, which requires a width-to-length ratio (W/L) of the channel of the driving thin film transistor in the pixel driving circuit to be reduced. Due to the width of the channel of the driving thin film transistor is limited by manufacturing process, the width-to-length ratio (W/L) of the channel of the driving thin film transistor is usually reduced by increasing the length of the channel, thereby reducing the current of the organic light emitting diode. However, high PPI, high resolution and high refresh rate are trends in AMOLED display products, high resolution and high refresh rate will shorten the charging time of each row of the pixels, which will affect the charging rate of the gate of the pixel driving thin film transistor. In order to increase the charging rate, it is necessary to increase the width-to-length ratio of the channel of the driving thin film transistor.

Technical Problem

With the developments of AMOLED display technologies, the width-to-length ratio of the channel of the pixel driving thin film transistor is difficult to simultaneously meet the requirements of reducing the current of the organic light emitting diode and increasing the charging rate of the gate of the pixel driving thin film transistor.

In addition, in AMOLED display products, the number of the driving thin film transistors in the pixel driving circuit is large, and an occupied area or space in the layout design is relatively large, which affects the design of high pixel density (Pixels Per Inch, PPI) products.

Technical Solution

The main purpose of the present disclosure is to provide a pixel driving circuit and a driving method thereof, which aims to solve the problem that the width-to-length ratio design of a channel of a pixel driving thin film transistor of the prior art is difficult to simultaneously meet the requirements of reducing the current of the organic light emitting diode and increasing the charging rate of the gate of the driving thin film transistor of the pixel.

The main purpose of the present disclosure is further to provide a layout structure of a transistor, which aims to solve the problem that the number of the driving thin film transistors in the pixel driving circuit of the prior art is large, and the occupied area or space in the layout design is relatively large, which affects the design of the high pixel density products.

In a first aspect, an embodiment of the present disclosure provides a pixel driving circuit, wherein the pixel driving circuit includes:

a storage capacitor, having a first terminal connected to a first voltage source, and a second terminal;

an organic light emitting diode, having an anode terminal, and a cathode terminal connected to a second voltage source;

a first switching transistor, having a first terminal connected to the second terminal of the storage capacitor, a second terminal for receiving a reference voltage, and a control terminal for receiving a first control signal;

a second switching transistor, having a first terminal for receiving a data signal input, a second terminal, and a control terminal for receiving a second control signal;

a third switching transistor, having a first terminal, a second terminal connected to the first terminal of the first switching transistor, and a control terminal for receiving the second control signal;

a fourth switching transistor, having a first terminal connected to the second terminal of the second switching transistor, a second terminal, and a control terminal connected to the second terminal of the storage capacitor;

a fifth switching transistor, having a first terminal connected to the anode terminal of the organic light emitting diode, a second terminal for receiving the reference voltage, and a control terminal for receiving a third control signal;

a sixth switching transistor, having a first terminal connected to the first voltage source, a second terminal, and a control terminal for receiving a driving signal;

a first driving transistor, having a first terminal connected to the second terminal of the sixth switching transistor, a second terminal connected to the second terminal of the fourth switching transistor, and a control terminal connected to the second terminal of the storage capacitor;

a second driving transistor, having a first terminal connected to the second terminal of the fourth switching transistor, a second terminal connected to the first terminal of the third switching transistor, and a control terminal connected to the second terminal of the storage capacitor;

a seventh switching transistor, having a first terminal connected to the second terminal of the second driving transistor, a second terminal connected to the anode terminal of the organic light emitting diode, and a control terminal for receiving the driving signal.

In one embodiment, the width-to-length ratio W1/L1 of the first driving transistor, the width-to-length ratio W2/L2 of the second driving transistor, and the width-to-length ratio W3/L3 of the fourth switching transistor meet the following relationships, W1 referring to a width of the first driving transistor, L1 referring to a length of the first driving transistor, W2 referring to a width of the second driving transistor, L2 referring to a length of the second driving transistor, W3 referring to a width of the third driving transistor, L3 referring to a length of the third driving transistor:

W1=W2=W3, L1/L2=1, L3<L2; or
W1=W2=W3, L1/L2>1, L3<L2; or
W1=W2=W3, L1/L2<1, L3<L2; or
W1=W2<W3, L1/L2=1 or L1/L2>1 or L1/L2<1, L3<L2; or
W1=W2>W3, L1/L2=1 or L1/L2>1 or L1/L2<1, L3<L2.

In an embodiment, the potential of the voltage of the reference voltage equals to the potential of the voltage provided by the second voltage source.

In an embodiment, the reference voltage is an independent voltage source.

In an embodiment, the first to seventh switching transistors, and the first driving transistor and the second driving transistor all have the same channel type.

In a second aspect, an embodiment of the present disclosure provides a driving method of the pixel driving circuit, which includes:

a first phase, during which the control terminal of the first switching transistor receives the first control signal and is turned on, and the control terminals of the fourth switching transistor, the first driving transistor, and the second driving transistor are initialized to be reference voltages;

a second phase, during which the control terminals of the second switching transistor and the third switching transistor receive the second control signal and are turned on, and a data signal $V_{data}$ of the data signal input is supplied to the second terminal of the storage capacitor;

a third phase, during which the control terminal of the fifth switching transistor receives the third control signal and is turned on, and the anode terminal of the organic light emitting diode is reversely initialized to the reference voltage;

a fourth phase, during which the control terminals of the sixth switching transistor and the seventh switching transistor receive the driving signal and are turned on, and the organic light emitting diode starts to emit light.

In an embodiment, in a second phase, voltages of the control terminals of the fourth switching transistor, the first driving transistor, and the second driving transistor reach $V_{data}-|V_{th2}|$, wherein $V_{th2}$ is a threshold voltage of the second driving transistor.

In an embodiment, in the fourth phase, the current flowing through the organic light emitting diode is: $I=\frac{1}{2} \times U \times C_{ox} \times [W/(L1+L2)] \times (V_{data}-VDD)^2$, wherein U is a mobility of the first driving transistor and the second driving transistor, and $C_{ox}$ is a per unit area capacitance of a gate insulating layer of the first driving transistor and the second driving transistor.

In a third aspect, the embodiments of the present disclosure provide an array substrate which includes the pixel driving circuit.

In a fourth aspect, the embodiments of the present disclosure provide a display apparatus, which includes the array substrate.

In a fifth aspect, the embodiments of the present disclosure provide a layout structure of a transistor, the layout structure includes a circuit node and an active layer connected to the circuit node; the active layer includes a first active layer, and a second active layer and a third active layer; and a first source connected to the first active layer, a drain connected to the second active layer, and a second source connected to the third active layer;

a first gate, a second gate, and a third gate respectively corresponding to the first active layer, the second active layer, and the third active layer; a gate pattern composed of the first gate, the second gate and the third gate locates above the circuit node and the active layer.

In an embodiment, the first active layer and the third active layer form an inverted "U"-shaped structure; and the second active layer forms an inverted "L"-shaped structure.

In an embodiment, the first active layer and the second active layer form a "ɯ"-shaped structure; and the third active layer forms an inverted "L"-shaped structure.

In an embodiment, the first active layer and the second active layer form an "n"-shaped structure; and the third active layer forms an inverted "L"-shaped structure.

In an embodiment, the gate pattern composed of the first gate, the second gate, and the third gate is configured in parallelogram shape with right angles or polygon shape.

Advantageous

In the pixel driving circuits and the driving method of the embodiments of the present disclosure, the organic light emitting diode is driven by the first driving transistor and second driving transistor connected in series; when the pixel is charged, the pixel driving circuit can compensate the threshold voltages of the second driving transistor and the four switching transistor connected in series, and can simultaneously meet the requirement of reducing the current of the organic light emitting diode and increasing the charging rate of the gate of the pixel driving transistor.

In the layout structures of the transistors of the embodiments of the present disclosure, the gates of three transistors form a same pattern, and circuit nodes formed by connecting the drains of two transistors and the source of the third transistor are located under the gate pattern. This design can reduce the layout areas of the three transistors, reduce the difficulty of layout design, and improve the application range.

DETAILED DESCRIPTION OF PREFERRED EMBODIMENTS

Figure 1:
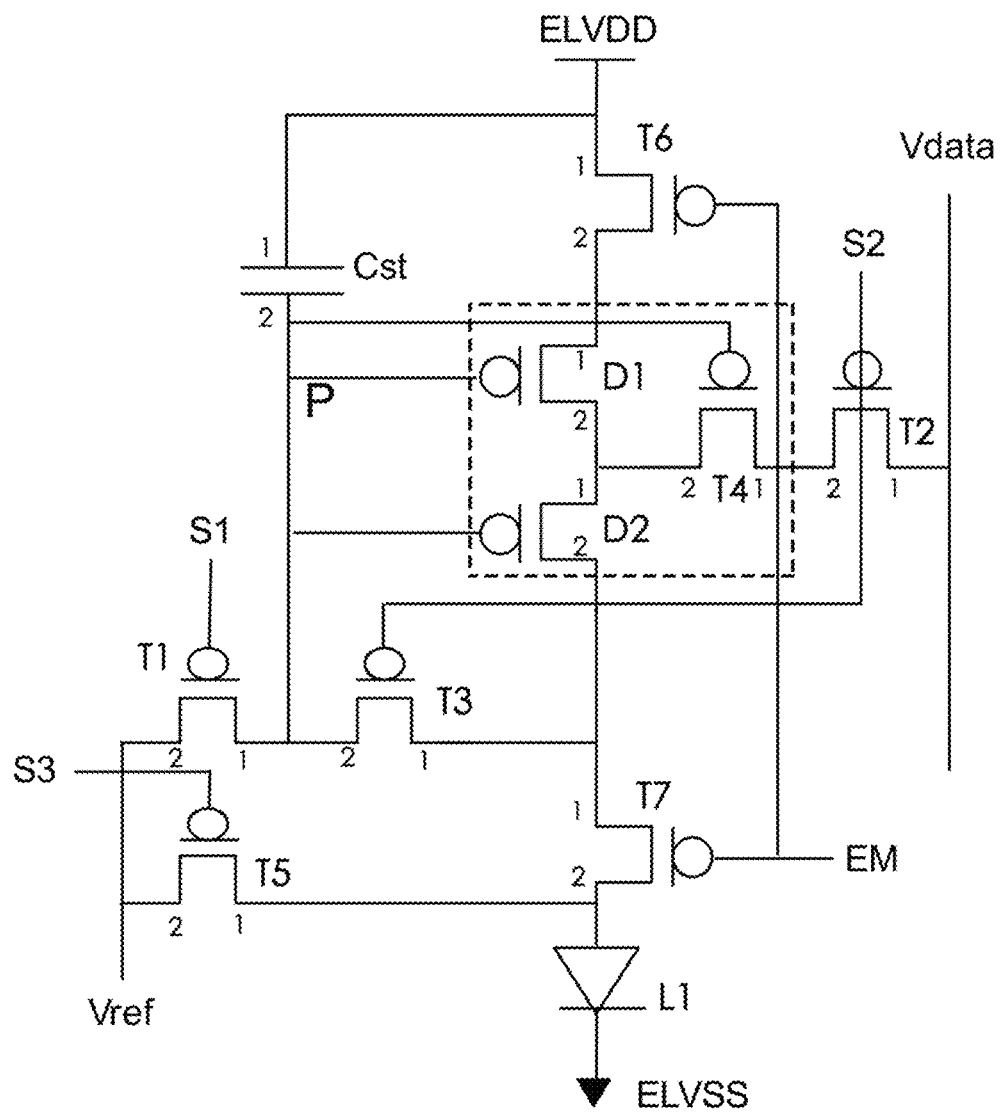
FIG. 1 is a schematic structural view of a pixel driving circuit according to an embodiment of the present disclosure.

In order to further explain the technical means and effects for achieving the intended purpose of the present disclosure, the specific embodiments, structures, features and functions of the present disclosure will be described in detail with reference to the accompanying drawings and preferred embodiments.

The embodiments of the present disclosure will now be described with reference to the accompanying drawings, in which the suffixes, such as "module", "part" or "unit" are just for facilitating the description of the disclosure, and do not have specific meanings in themselves.

The switching transistors and the driving transistors in the embodiments of the present disclosure may be thin film transistors or field effect transistors or other devices having the same performances. Since the source and the drain of the switching transistor in the embodiments are symmetrically disposed, the sources and the drains are interchangeable. In the embodiments of the present disclosure, in order to distinguish the other two electrodes of the transistor except the gate electrode, one of the electrodes is called as a source and the other one is called as a drain. According to the form in the drawing, the control terminal of the transistor is the gate, the first terminal is the source, and the second terminal is the drain. In addition, the switching transistors used in the embodiments of the present disclosure include two types of switching transistors, i.e., a P-type switching transistor and an N-type switching transistor, wherein the P-type switching transistor is turned on when the gate is at a low level, and turned off when the gate is at a high level, and the N-type switching transistor is turned on when the gate is at a high level and turned off when the gate is at a low level.

It should be noted that, all the switching transistors and the driving transistors of the pixel driving circuit in the drawing are P-type transistors, and those skilled in the art can easily know that all the switching transistors and the driving transistors of the pixel driving circuit in the present disclosure can be easily changed to N-type transistors.

Referring to FIG. 1, an embodiment of the present disclosure provides a pixel driving circuit, wherein the pixel driving circuit includes:

a storage capacitor Cst, having a first terminal connected to a first voltage source ELVDD, and a second terminal;

an organic light emitting diode L1, having an anode terminal, and a cathode terminal connected to a second voltage source ELVSS;

a first switching transistor T1, having a first terminal connected to the second terminal of the storage capacitor Cst, a second terminal for receiving a reference voltage Vref, and a control terminal for receiving a first control signal S1;

a second switching transistor T2, having a first terminal for receiving a data signal $V_{data}$ from a data signal input, a second terminal, and a control terminal for receiving a second control signal S2;

a third switching transistor T3, having a first terminal, a second terminal connected to the first terminal of the first switching transistor T1, and a control terminal for receiving the second control signal S2;

a fourth switching transistor T4, having a first terminal connected to the second terminal of the second switching transistor T2, a second terminal, and a control terminal connected to the second terminal of the storage capacitor Cst;

a fifth switching transistor T5, having a first terminal connected to the anode terminal of the organic light emitting diode L1, a second terminal for receiving the reference voltage Vref, and a control terminal for receiving a third control signal S3;

a sixth switching transistor T6, having a first terminal connected to the first voltage source ELVDD, a second terminal, and a control terminal for receiving a driving signal EM;

a first driving transistor D1, having a first terminal connected to the second terminal of the sixth switching transistor T6, a second terminal connected to the second terminal of the fourth switching transistor T4, and a control terminal connected to the second terminal of the storage capacitor Cst;

a second driving transistor D2, having a first terminal connected to the second terminal of the fourth switching transistor T4, a second terminal connected to the first terminal of the third switching transistor T3, and a control terminal connected to the second terminal of the storage capacitor Cst;

a seventh switching transistor T7, having a first terminal connected to the second terminal of the second driving transistor D2, a second terminal connected to the anode terminal of the organic light emitting diode L1, and a control terminal for receiving the driving signal EM.

In the present embodiment, the width-to-length ratio W1/L1 of the first driving transistor D1, the width-to-length ratio W2/L2 of the second driving transistor D2, and the width-to-length ratio W3/L3 of the fourth switching transistor T4 meet the following relationships, W1 referring to a width of the first driving transistor, L1 referring to a length of the first driving transistor, W2 referring to a width of the second driving transistor, L2 referring to a length of the second driving transistor, W3 referring to a width of the third driving transistor, L3 referring to a length of the third driving transistor:

W1=W2=W3, L1/L2=1, L3<L2; or
W1=W2=W3, L1/L2>1, L3<L2; or
W1=W2=W3, L1/L2<1, L3<L2; or
W1=W2<W3, L1/L2=1 or L1/L2>1 or L1/L2<1, L3<L2; or
W1=W2>W3, L1/L2=1 or L1/L2>1 or L1/L2<1, L3<L2.

It should be noted that, the design of the width-to-length ratio W1/L1 of the first driving transistor D1, the width-to-length ratio W2/L2 of the second driving transistor D2, and the width-to-length ratio W3/L3 of the fourth switching transistor T4 are not limited to embodiments listed above, the width-to-length ratios of D1, D2, and T4 designed according to the pixel driving circuits of the embodiments of the present disclosure are all within the scope of this disclosure.

In this embodiment, the first to seventh switching transistors T1 to T7, the first driving transistor D1 and the second driving transistor D2 all have the same channel type.

In one possible embodiment, the potential of the reference voltage Vref equals to the potential of the voltage provided by the second voltage source ELVSS.

In another possible embodiment, the reference voltage Vref may be an independent voltage source.

In the pixel driving circuit of the embodiment of the present disclosure, the organic light emitting diode is driven by the first driving transistor and the second driving transistor connected in series; when the pixel is charged, the pixel driving circuit can compensate the threshold voltages of the second driving transistor and the fourth switching transistor connected in series; and can simultaneously meet the requirements of reducing the current of the organic light emitting diode and increasing the charging rate of the gate of the pixel driving transistor.

Figure 2:
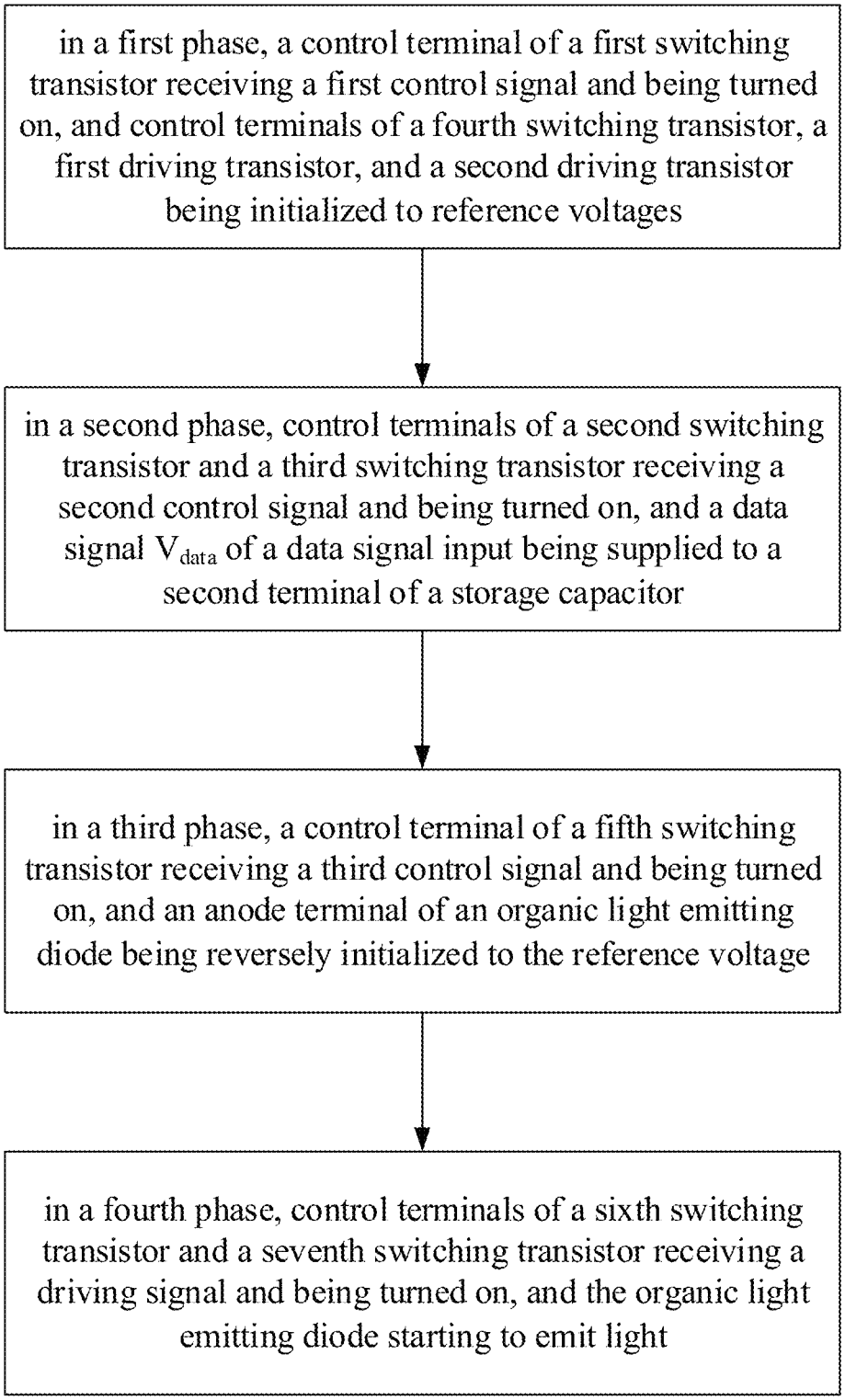
FIG. 2 is a flow chart of a driving method of a pixel driving circuit according to an embodiment of the present disclosure.
Figure 3:
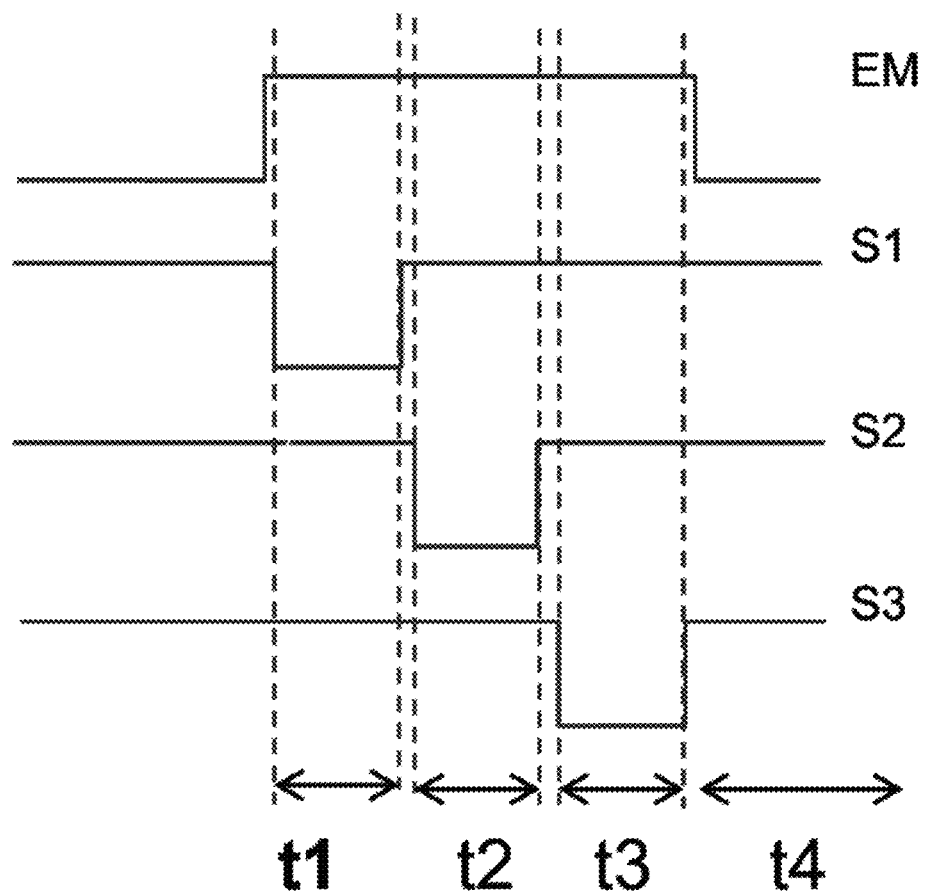
FIG. 3 is a signal timing diagram of a pixel driving circuit according to an embodiment of the present disclosure.
Figure 4:
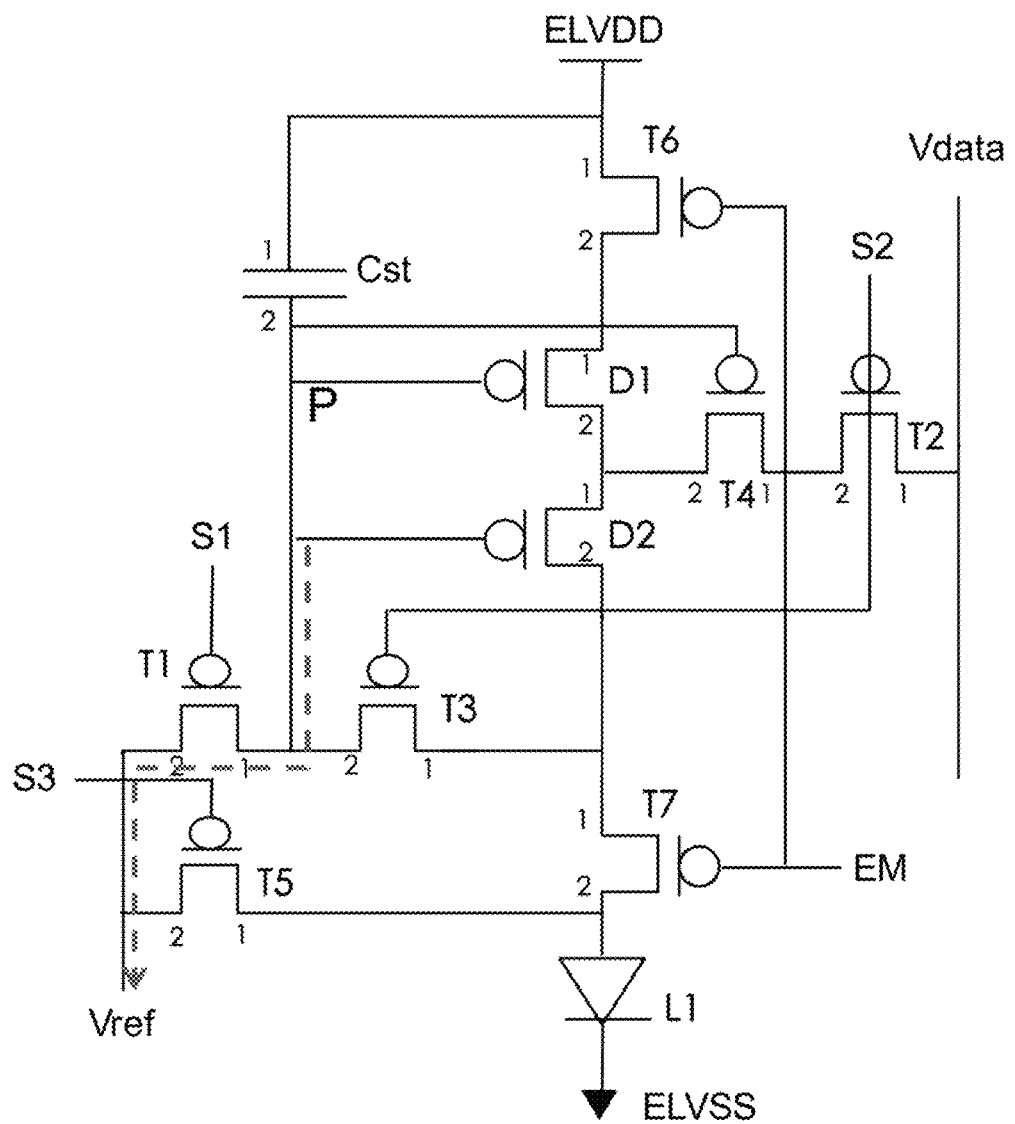
FIG. 4 to FIG. 7 are schematic views showing current flow of a pixel driving circuit according to an embodiment of the present disclosure.
Figure 5:
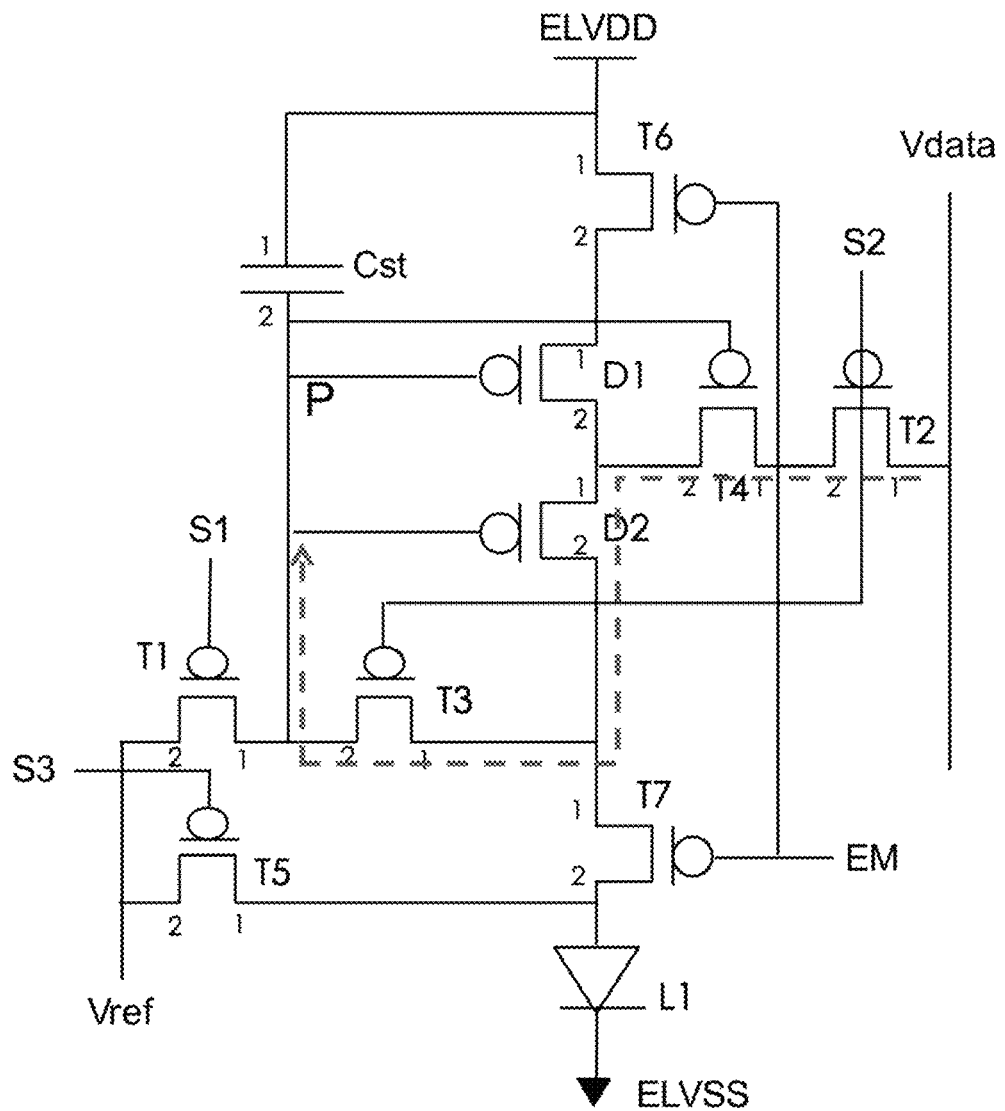
Figure 6:
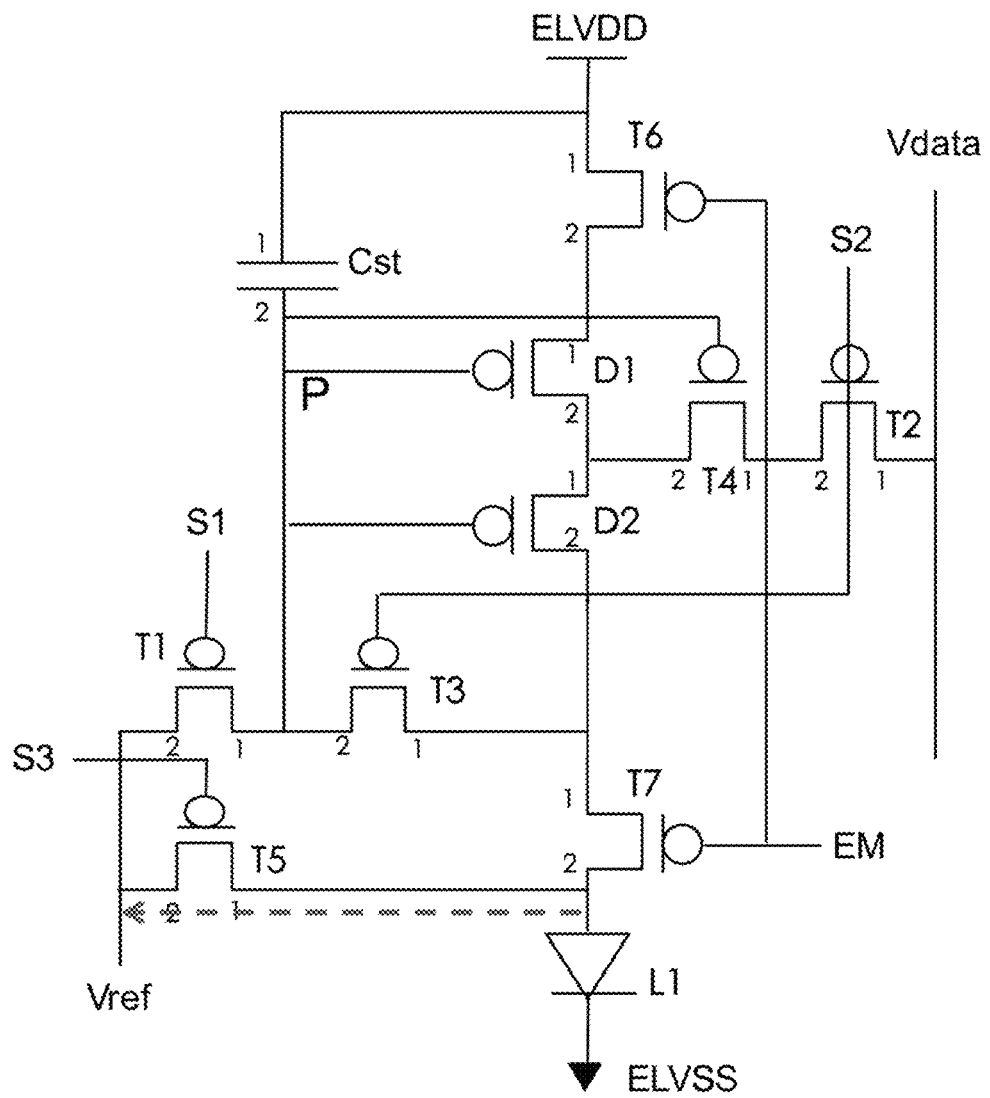
Figure 7:
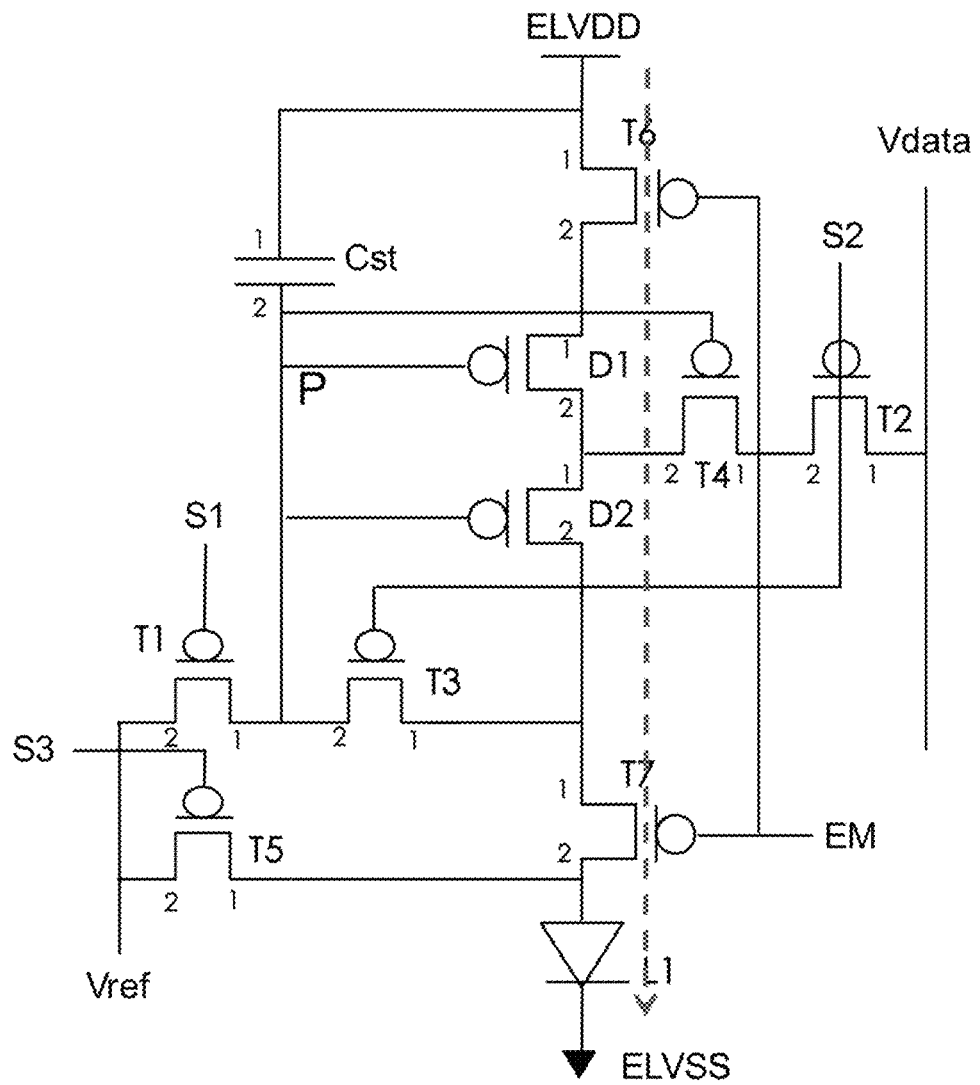

As shown in FIG. 2, an embodiment of the present disclosure further provides a driving method of a pixel driving circuit, wherein the driving method includes:

a first phase, wherein the control terminal of the first switching transistor T1 receives the first control signal S1 and is turned on, and the control terminals of the fourth switching transistor T4, the first driving transistor D1 and the second driving transistor D2 are initialized to the reference voltage Vref;

a second phase, wherein the control terminals of the second switching transistor T2 and the third switching transistor T3 receive the second control signal S2 and are turned on, and the data signal $V_{data}$ from the data signal input is supplied to the second terminal of the storage capacitor Cst;

In this embodiment, the voltages of the control terminals of the fourth switching transistor T4, the first driving transistor D1, and the second driving transistor D2 may reach $V_{data}-|V_{th2}|$, wherein $V_{th2}$ is the threshold voltage of the second driving transistor D2.

a third phase, wherein the control terminal of the fifth switching transistor T5 receives the third control signal S3 and is turned on, and the anode terminal of the organic light emitting diode L1 is reversely initialized to the reference voltage Vref;

a fourth phase, the control terminals of the sixth switching transistor T6 and the seventh switching transistor T7 receive the driving signal and are turned on, and the organic light emitting diode L1 starts to emit light.

In this embodiment, the current flowing through the organic light emitting diode is: $I=\frac{1}{2}\times U\times C_{ox}\times[W/(L1+L2)]\times(V_{data}-VDD)^2$, wherein U is the mobility of the first driving transistor D1 and the second driving transistor D2, $C_{ox}$ is the per unit area capacitance of the gate insulating layer of the first driving transistor D1 and the second driving transistor D2.

As an example, further explanations are given in conjunction with FIG. 3 to FIG. 7:

In phase t1, the first control signal S1 is at a low level, the second control signal S2, the third control signal S3, and the driving signal EM are at high levels; at this time, the control terminal of the first switching transistor T1 receives the low electrical level of the first control signal S1 and is turned on, and the control terminals of the fourth switching transistor T4, the first driving transistor D1, and the second driving transistor D2 are initialized to be the reference voltage Vref. The current flow direction can be shown by the dotted line in FIG. 4.

In phase t2, the second control signal S2 is at a low level, the first control signal S1, the third control signal S3, and the driving signal EM are at high levels; at this time, the control terminals of the second switching transistor T2 and the third switching transistor T3 receive the low electrical level of the second control signal S2 and are turned on, and the data signal $V_{data}$ from the data signal input is supplied to the second terminal of the storage capacitor Cst. The current flow direction can be shown by the dotted line in FIG. 5. It should be noted that, at this time, the second driving transistor D2 and the fourth switching transistor T4 can be regarded as a transistor having a width-to-length ratio of W/(L2+L3). During a short charging time t2, the voltage of point P can be rapidly written as $V_{data}-|V_{th2}|$, wherein $V_{th2}$ is the threshold voltage of the second driving transistor D2. Under this circumstance, the threshold voltage of the transistor composed of the second driving transistor D2 and the fourth switching transistor T4 is mainly determined by the second drive transistor D2.

In phase t3, the third control signal S3 is at a low level, the first control signal S1, the second control signal S2, and the driving signal EM are at high levels; at this time, the control terminal of the fifth switching transistor T5 receives the low electrical level of the third control signal S3 and is turned on, and the anode terminal of the organic light emitting diode L1 is reversely initialized to the reference voltage Vref. The current flow direction can be shown by the dotted line in FIG. 6.

In phase t4, the driving signal EM is at a low level, the first control signal S1, the second control signal S2, and third control signal S3 are at high levels; at this time, the control terminals of the sixth switching transistor T6 and the seventh switching transistor T7 receive the low level of the driving signal and are turned on, and the organic light emitting diode L1 starts to emit light. The current flow direction can be shown by the dotted line in FIG. 7. It should be noted that, at this time, since the first driving transistor D1 and the second driving transistor D2 are connected in series, and their gates are connected together, and therefore can be regarded as a transistor having a width-to-length ratio of W/(L1+L2). This transistor works in the saturation region, and $V_{th}$ is mainly determined by $V_{th2}$ of the second driving transistor D2. According to the calculation formula of the saturation region current, the current flowing through the organic light emitting diode is: $I=\frac{1}{2}\times U\times C_{ox}\times[W/(L1+L2)]\times(V_{data}-VDD)^2$, wherein U is the mobility of the first driving transistor D1 and the second driving transistor D2, and $C_{ox}$ is the per unit area capacitance of the gate insulating layer of the first driving transistor D1 and the second driving transistor D2.

In the driving method of the pixel driving circuit of the embodiment of the present disclosure, the organic light emitting diode is driven by the first driving transistor and the second driving transistor connected in series; when the pixel is charged, the pixel driving circuit can compensate the threshold voltages of the second driving transistor and the fourth switching transistor connected in series; and can simultaneously meet the requirements of reducing the current of the organic light emitting diode and increasing the charging rate of the gate of the pixel driving transistor.

An embodiment of the present disclosure further provides an array substrate, including:

a plurality of data signal lines arranged along a column direction;

a plurality of control signal lines and driving signal lines arranged along a row direction;

a plurality of pixels arranged in a matrix form and at positions where the data signal lines intersect the control signal lines;

wherein the pixel includes the pixel driving circuit described above.

In the array substrate of the embodiment of the present disclosure, the organic light emitting diode is driven by the first driving transistor and the second driving transistor connected in series; when the pixel is charged, the pixel driving circuit can compensate the threshold voltages of the second driving transistor and the fourth switching transistor connected in series; and can simultaneously meet the requirements of reducing the current of the organic light emitting diode and increasing the charging rate of the gate of the pixel driving transistor.

The embodiment of the present disclosure further provides a display apparatus including the array substrate described above. In addition, the display apparatus can be a display device such as an electronic paper, a mobile phone, a television, a digital photo frame, or etc.

In the display apparatus of the embodiment of the present disclosure, the organic light emitting diode is driven by the first driving transistor and the second driving transistor connected in series; when the pixel is charged, the pixel driving circuit can compensate the threshold voltages of the second driving transistor and the fourth switching transistor connected in series; and can simultaneously meet the requirements of reducing the current of the organic light emitting diode and increasing the charging rate of the gate of the pixel driving transistor.

Figure 8:
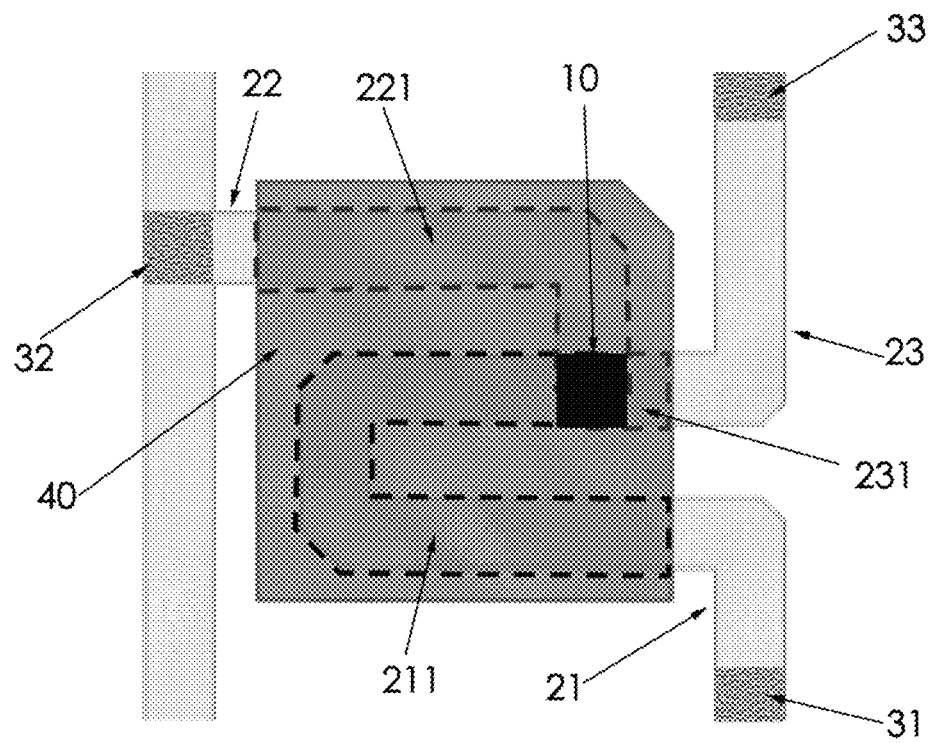
FIG. 8 is a schematic view of a layout structure of a transistor according to an embodiment of the present disclosure.
Figure 9:
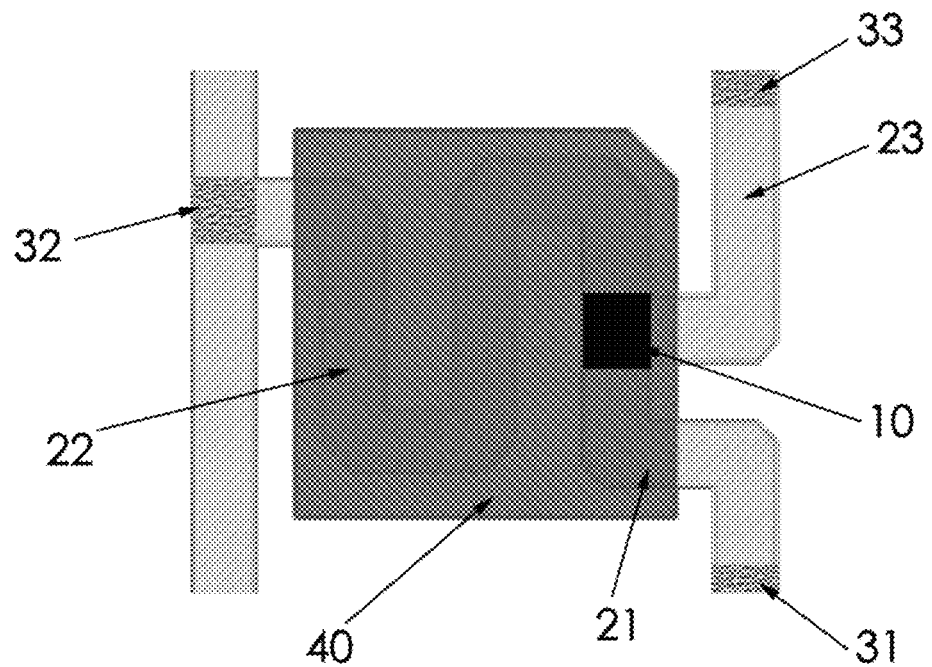
FIG. 9 is a schematic view of another layout structure of a transistor according to an embodiment of the present disclosure.
Figure 10:
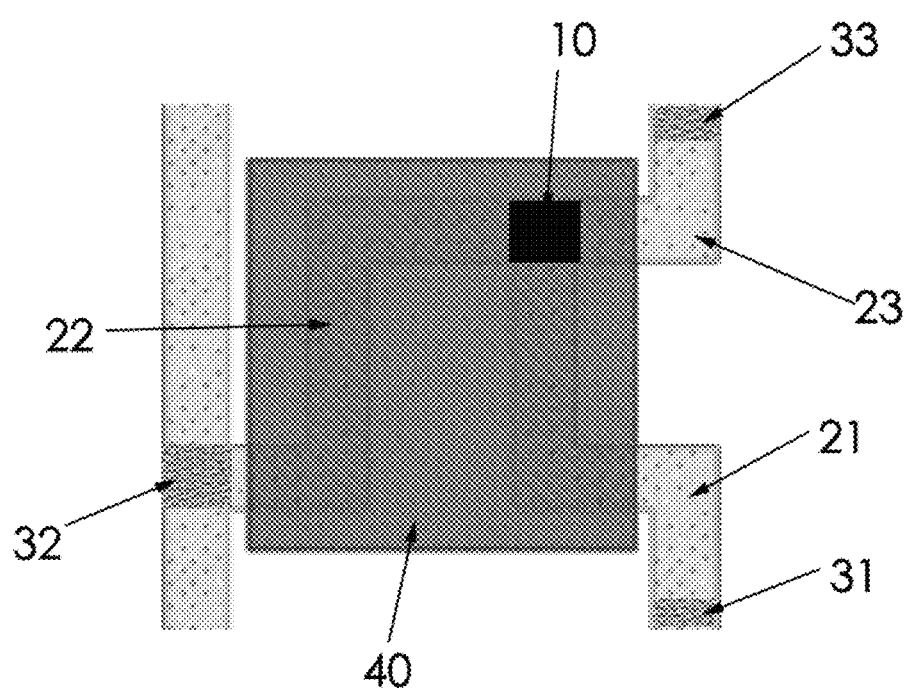
FIG. 10 is a schematic view of a further layout structure of a transistor according to an embodiment of the present disclosure.

As shown in FIG. 8 to FIG. 10, an embodiment of the present disclosure further provides a layout structure of a transistor, the layout structure includes a circuit node 10 and an active layer connected to the circuit node 10.

In the present embodiment, the active layer includes a first active layer 21, a second active layer 22, and a third active layer 23.

Referring to FIG. 8, in a possible embodiment, the first active layer 21 and the third active layer 23 form an inverted "U"-shaped structure; the second active layer 22 forms an inverted "L"-shaped structure.

Referring to FIG. 9, in another possible embodiment, the first active layer 21 and the second active layer 22 form a in "ㄩ"-shaped structure; the third active layer 23 forms an inverted "L"-shaped structure.

Referring to FIG. 10, in another possible embodiment, the first active layer 21 and the second active layer 22 form an "n"-shaped structure; the third active layer 23 forms an inverted "L"-shaped structure.

A first source 31 is connected to the first active layer 21, a drain 32 is connected to the second active layer 22, and a second source 33 is connected to the third active layer 23.

The layout structure further includes a first gate, a second gate, and a third gate corresponding to the first active layer 21, the second active layer 22, and the third active layer 23, respectively; a gate pattern 40 composed of the first gate, the second gate and the third gate is located above the circuit node 10 and the active layer.

Referring to FIG. 8 to FIG. 10, in the embodiment, the gate pattern 40 is substantially in parallelogram shape with right angles, such as square or rectangle; the gate pattern may also be in polygon shape, that is, a plane graphic be formed by four or more line segments connected head to tail.

Referring back to FIG. 8, an active layer portion covered by the gate pattern 40 is a channel region, and a first active layer portion 211 (circled by the dashed box of the figure) of the first active layer 21 covered by the gate pattern 40 is a first channel, a second active layer portion 221 (circled by the dashed box of the figure) of the second active layer 22 covered by the gate pattern 40 is a second channel, and a third active layer portion 231 (circled by the dashed box of the figure) of the third active layer 23 covered by the gate pattern 40 is a third channel.

The first source 31, the first active layer 21 and the circuit node 10 form a current flowing channel; the second source 33, the third active layer 23 and the circuit node 10 form a current flowing channel; the circuit node 10, the second active layer 22 and the drain 32 form a current flowing channel. Therefore, the layout structure is equivalent to a layout composed of three transistors, that is, the drains of two transistors and the source of a third transistor are connected together to form a circuit node, and the gates of the three transistors are connected together.

It should be noted that, the layout structure of the transistor of the embodiment of the present disclosure is not only applicable to bottom gate transistors but also applicable to top gate transistors.

The manufacturing processes of the top gate transistors and the bottom gate transistors are different. The manufacturing process of the top gate transistor is as follows:

S1: depositing a buffer layer and an active layer, and patterning an active layer;

S2: depositing a gate insulating layer and a gate metal layer, and patterning the gate metal layer;

S3: P+ doping a source and a drain of the transistor.

The manufacturing process of the bottom gate transistor is as follows:

S10, depositing a buffer layer and a gate metal layer, and patterning the gate metal layer;

S11, depositing a gate insulating layer and an active layer, and patterning the active layer;

S12, coating and patterning doped barrier layer, and P+ doping a source and a drain of the transistor;

S13, peeling off the barrier layer of a gate.

In the layout structure of the transistor of the embodiment of the present disclosure, the layout structure of the transistor equivalents to a pattern composed of the gates of three transistors, and the circuit node formed by connecting the drains of two transistors and the source of the third transistor is located under the gate pattern. This design can reduce the layout area of the three transistors, reduce the difficulty of layout design, and improve the application range.

The embodiment of the present disclosure further provides a pixel driving circuit, the pixel driving circuit includes a first driving transistor, a second driving transistor, and a switching transistor; wherein the layout structure composed of the first driving transistor, the second driving transistor, and the switching transistor is the layout structure described above.

In this embodiment, the width-to-length ratio $W1/L1$ of the first driving transistor, the width-to-length ratio $W2/L2$ of the second driving transistor, and the width-to-length ratio $W3/L3$ of the switching transistor meet the following relationship:

$W1=W2=W3$, $L1/L2=1$, $L3<L2$; or $W1=W2=W3$, $L1/L2>1$, $L3<L2$; or $W1=W2=W3$, $L1/L2<1$, $L3<L2$; or $W1=W2<W3$, $L1/L2=1$ or $L1/L2>1$ or $L1/L2<1$, $L3<L2$; or $W1=W2>W3$, $L1/L2=1$ or $L1/L2>1$ or $L1/L2<1$, $L3<L2$.

It should be noted that, the designs of the width-to-length ratio $W1/L1$ of the first driving transistor, the width-to-length ratio $W2/L2$ of the second driving transistor, and the width-to-length ratio $W3/L3$ of the switching transistor are not limited to the embodiments listed above. The width-to-length ratio design of the pixel driving circuit according to the embodiment of the present disclosure should be within the scope of the patent disclosure.

As an example, referring to FIG. 1, the pixel driving circuit of FIG. 1 includes a first driving transistor D1, a second driving transistor D2, and a fourth switching transistor T4 (circled by a dashed box of the figure). A second terminal (the drain) of the first driving transistor D1, a second terminal (the drain) of the fourth switching transistor T4, and a first terminal (the source) of the second driving transistor D2 are connected together to form a circuit node; the gate of the first driving transistor D1, the gate of the second driving transistor D2, and the gate of the fourth switching transistor T4 are connected together, and the layout structure thereof is as described above.

In the pixel driving circuit of the embodiment of the present disclosure, the gates of the three transistors form a same pattern, and the circuit node formed by connecting the drains of two transistors and the source of the third transistor is located under the gate pattern. This design can reduce the layout area of the three transistors, reduce the difficulty of layout design, and improve the application range.

The present disclosure further provides an array substrate including:

a plurality of data signal lines arranged along a column direction;

a plurality of control signal lines and driving signal lines arranged along a row direction;

a plurality of pixels arranged in a matrix form and at positions where the data signal lines intersect the control signal lines;

the pixel includes the pixel driving circuit described above.

In the array substrate of the embodiment of the present disclosure, the gates of three transistors form a same pattern, and the circuit node formed by connecting the drains of two transistors and the source of the third transistor is located under the gate pattern. The design can reduce the layout area of the three transistors, reduce the difficulty of layout design, and improve the application range.

The present disclosure further provides a display apparatus including the array substrate described above. In addition, the display apparatus can also be a display device such as an electronic paper, a mobile phone, a television, a digital photo frame, or etc.

In the display apparatus of the embodiment of the present disclosure, the gates of three transistors form a same pattern, and the circuit node formed by connecting the drains of two transistors and the source of the third transistor is located under the gate pattern. The design can reduce the layout area of the three transistors, reduce the difficulty of layout design, and improve the application range.

The above are only preferred embodiments of the present disclosure, and are not intended to limit the present disclosure. Any modifications, equivalents, improvements, etc., which are within the spirit and scope of the present disclosure, should be included within the scope of the present disclosure.

INDUSTRIAL APPLICABILITY

In the pixel driving circuit and the driving method of the embodiments of the present disclosure, the organic light emitting diode is driven by the first driving transistor and the second driving transistor connected in series; when the pixel is charged, the pixel driving circuit can compensate the threshold voltages of the second driving transistor and the four switching transistor connected in series; and can simultaneously meet the requirements of reducing the current of the organic light emitting diode and increasing the charging rate of the gate of the pixel driving transistor.

In the layout structure of the transistor of the embodiment of the present disclosure, the gates of three transistors form a same pattern, and the circuit node formed by connecting the drains of two transistors and the source of the third transistor is located under the gate pattern. This design can reduce the layout area of the three transistors, reduce the difficulty of layout design, and improve the application range.

What is claimed is:

1. A pixel driving circuit, comprising:

a storage capacitor, having a first terminal connected to a first voltage source, and a second terminal;

an organic light emitting diode, having an anode terminal, and a cathode terminal connected to a second voltage source;

a first switching transistor, having a first terminal connected to the second terminal of the storage capacitor, a second terminal receiving a reference voltage, and a control terminal receiving a first control signal;

a second switching transistor, having a first terminal receiving a data signal input, a second terminal, and a control terminal receiving a second control signal;

a third switching transistor, having a first terminal, a second terminal connected to the first terminal of the first switching transistor, and a control terminal receiving the second control signal;

a fourth switching transistor, having a first terminal connected to the second terminal of the second switching transistor, a second terminal, and a control terminal connected to the second terminal of the storage capacitor;

a fifth switching transistor, having a first terminal connected to the anode terminal of the organic light emitting diode, and a second terminal receiving the reference voltage, and a control terminal receiving a third control signal;

a sixth switching transistor, having a first terminal connected to the first voltage source, a second terminal, and a control terminal receiving a driving signal;

a first driving transistor, having a first terminal connected to the second terminal of the sixth switching transistor, a second terminal connected to the second terminal of the fourth switching transistor, and a control terminal connected to the second terminal of the storage capacitor;

a second driving transistor, having a first terminal connected to the second terminal of the fourth switching transistor, a second terminal connected to the first terminal of the third switching transistor, and a control terminal connected to the second terminal of the storage capacitor;

a seventh switching transistor, having a first terminal connected to the second terminal of the second driving transistor, a second terminal connected to the anode terminal of the organic light emitting diode, and a control terminal for receiving the driving signal.

2. The pixel driving circuit according to claim 1, wherein a width-to-length ratio W1/L1 of the first driving transistor, a width-to-length ratio W2/L2 of the second driving transistor, and a width-to-length ratio W3/L3 of the fourth switching transistor meet the following relationship, W1 referring to a width of the first driving transistor, L1 referring to a length of the first driving transistor, W2 referring to a width of the second driving transistor, L2 referring to a length of the second driving transistor, W3 referring to a width of the third driving transistor, L3 referring to a length of the third driving transistor:

W1=W2=W3, L1/L2=1, L3<L2; or
W1=W2=W3, L1/L2>1, L3<L2; or
W1=W2=W3, L1/L2<1, L3<L2; or
W1=W2<W3, L1/L2=1 or L1/L2>1 or L1/L2<1, L3<L2; or
W1=W2>W3, L1/L2=1 or L1/L2>1 or L1/L2<1, L3<L2.

3. The pixel driving circuit according to claim 1, wherein a potential of the reference voltage equals to a potential of a voltage supplied from the second voltage source.

4. The pixel driving circuit according to claim 1, wherein the reference voltage is an independent voltage source.

5. The pixel driving circuit according to claim 1, wherein the first to seventh switching transistors, and the first driving transistor and the second driving transistor all have the same channel type.

6. A driving method for driving a pixel driving circuit of claim 1, wherein the driving method comprises:
   in a first phase, the control terminal of the first switching transistor receiving the first control signal and being turned on, and the control terminals of the fourth switching transistor, the first driving transistor, and the second driving transistor being initialized to be reference voltages;
   in a second phase, the control terminals of the second switching transistor and the third switching transistor receiving the second control signal and being turned on, and a data signal $V_{data}$ of the data signal input being supplied to the second terminal of the storage capacitor;
   in a third phase, the control terminal of the fifth switching transistor receiving the third control signal and being turned on, and the anode terminal of the organic light emitting diode being reversely initialized to the reference voltage;
   in a fourth phase, the control terminals of the sixth switching transistor and the seventh switching transistor receiving the driving signal and being turned on, and the organic light emitting diode starting to emit light.

7. The driving method of the pixel driving circuit according to claim 6, wherein in the second phase, voltages of the control terminals of the fourth switching transistor, the first driving transistor, and the second driving transistor reach $V_{data}-|V_{th2}|$, $V_{th2}$ being a threshold voltage of the second driving transistor.

8. The driving method of the pixel driving circuit according to claim 6, wherein in the fourth phase, a current flowing through the organic light emitting diode is: $I=\frac{1}{2} \times U \times C_{ox} \times [W/(L1+L2)] \times (V_{data}-V_{DD})^2$, wherein U is a mobility of the first driving transistor and the second driving transistor, and Cox is a per unit area capacitance of a gate insulating layer of the first driving transistor and the second driving transistor.

* * * * *